(12) United States Patent
Zeidan et al.

(10) Patent No.: US 6,477,053 B1
(45) Date of Patent: Nov. 5, 2002

(54) HEAT SINK AND ELECTRONIC ASSEMBLY INCLUDING SAME

(75) Inventors: Dany M. Zeidan, Howell, NJ (US); Jeffrey Eisenmann, Howell, NJ (US); David J. Maxham, Jamesburg, NJ (US)

(73) Assignees: Tyco Telecommunications (US) Inc., Morristown, NJ (US); TerraWorx, Inc., Shrewsbury, NJ (US)

( * ) Notice: Subject to any disclaimer, the term of this patent is extended or adjusted under 35 U.S.C. 154(b) by 0 days.

(21) Appl. No.: 09/907,090

(22) Filed: Jul. 17, 2001

(51) Int. Cl.⁷ .................................................. H05K 7/20
(52) U.S. Cl. .................. 361/719; 29/890.03; 165/80.3; 361/703; 454/184
(58) Field of Search ............................ 165/80.3, 185; 454/184; 257/706, 707, 722; 174/16.3, 35 R, 35 GC; 29/890.03, 890.045, 890.053, 505, 509, 557, 558; 361/703–7.5, 707–712, 717–719, 784, 785, 816, 818

(56) References Cited

U.S. PATENT DOCUMENTS

| | | | |
|---|---|---|---|
| 3,909,679 A | * 9/1975 | Petri | 361/710 |
| 4,122,508 A | 10/1978 | Rumbaugh | 361/384 |
| 4,203,147 A | * 5/1980 | Gabr | 361/721 |
| 4,237,521 A | 12/1980 | Denker | 361/384 |
| 4,953,058 A | * 8/1990 | Harris | 361/690 |
| 5,168,348 A | * 12/1992 | Chu et al. | 257/713 |
| 5,285,350 A | 2/1994 | Villaume | 361/690 |
| 5,455,739 A | 10/1995 | Barden | 361/719 |
| 5,713,690 A | 2/1998 | Corbin, Jr. et al. | 403/270 |
| 5,781,411 A | 7/1998 | Feenstra | 361/704 |
| 5,880,930 A | 3/1999 | Wheaton | 361/690 |
| 6,046,906 A | * 4/2000 | Tseng | 361/704 |
| 6,046,908 A | * 4/2000 | Feng | 361/707 |
| 6,101,096 A | * 8/2000 | MacGregor et al. | 361/720 |
| 6,134,783 A | 10/2000 | Bargman et al. | 29/890.03 |
| 6,151,215 A | 11/2000 | Hoffman | 361/704 |
| 6,195,493 B1 | * 2/2001 | Bridges | 385/134 |
| 6,212,074 B1 | 4/2001 | Gonsalves et al. | 361/717 |

* cited by examiner

*Primary Examiner*—Gerald Tolin

(57) ABSTRACT

A heat sink used in an electronic assembly includes mounting surfaces on a first side of a base portion and extended heat dissipating surfaces (e.g., fins) extending from a second side of the base portion. One or more electronic component boards, such as printed wiring boards (PWBs), are mounted to the mounting surfaces on the heat sink at one or more levels. Some of the mounting surfaces can be formed on mounting ridges, which define channels. Ventilation apertures located between the fins extend through the base portion such that air is drawn through the channels and up through the apertures creating a "chimney" effect. The heat sink is also grounded to at least one of the PWBS and electrically isolated from the chassis. Isolator bushings can be mounted in one or more of the fins for receiving pins extending from the chassis to insure mechanical support and isolation/dampening and to insure electrical isolation from the chassis.

15 Claims, 7 Drawing Sheets

HEAT SINK AND ELECTRONIC ASSEMBLY INCLUDING SAME

TECHNICAL FIELD

The present invention relates to heat sinks and more particularly to a heat sink with one or more printed wiring boards mounted thereto.

BACKGROUND INFORMATION

Electronic equipment, such as that used in the telecommunications industry, generates a significant amount of thermal energy or heat. One example of such electronic equipment is an optical amplifier used in a fiber optic telecommunication system. Advances in technology have resulted in smaller and more powerful electronic components, which generate more heat in a given smaller area. Excessive heat in electronic equipment can degrade performance and reliability of electronic components or cause a complete malfunction. In an optical amplifier module, for example, heat is generated by localized heat sources, such as laser pumps and other electronic components on a printed wiring board (PWB). The PWB is enclosed within a box, housing or chassis. One type of laser pump limits the maximum surface temperature rise to below 15° C. over a maximum ambient of 50° C.

The heat generated by the electronic equipment should be dissipated to prevent damage to and failure of the electronic equipment. Various approaches have been used to dissipate heat generated by electronic components. One approach is to use a heat sink to spread the heat in combination with fan units to provide forced convection cooling. One drawback of a forced convection system is the requirement of scheduled maintenance (e.g., a filter change), failures (e.g., fan motor malfunction and infrastructure to support the fan unit monitoring/alarms. The heat sinks used with electronic equipment employing forced convection cooling systems are typically not able to efficiently spread and dissipate heat from electronic equipment without fan units, for example, using natural convection and radiation cooling methods. Because of practical limitations on physical size, the majority of the space in the equipment is usually allocated to electronics rather than to relatively large passive cooling elements.

According to the existing approaches to heat dissipation using heat sinks, the heat sinks are typically mounted to the printed wiring boards (PWBs) using spacers or standoffs. The standoffs or spacers provide individual fastening points, but not continuous support. Between the spacers, the PWB is thus prone to deflection or bowing, making it difficult to maintain the thermal contact between the heat sink and the various surfaces of the electronic components having varying heights. In addition, the space or gap between the spacers is open and air stagnates in an uncontrolled fashion. In some cases, heat sinks are also electrically floating and/or do not span the full surface area of the PWB to provide an effective EMI shield and insure that there is no safety hazard with floating (ungrounded metal).

Accordingly, there is a need for a passive heat sink, capable of spreading and dissipating heat from electronic equipment (i.e., without having to use active fan units). There is also a need for a heat sink that provides mechanical and/or electrical functionality in addition to the improved thermal management.

SUMMARY

In accordance with one aspect of the present invention, a heat sink comprises a base portion having first and second sides and ventilation apertures extending through an approximately central section of the base portion. Mounting ridges extend from the first side of the base portion for defining at least one channel on the first side. Each channel is fluidly connected to the ventilation apertures. The mounting ridges include mounting surfaces for mounting to at least one electronic component board, which forms the other side of the channel(s). Extended heat dissipating surfaces extend from the second side of the base portion. The apertures are located between the extended heat dissipating surfaces. The ventilation apertures create a "chimney effect" and the channel(s) enhance(s) the chimney effect by channeling air beneath the heat sink to the ventilation apertures thus eliminating the presence of stagnating hot air.

In one preferred embodiment of the heat sink, the mounting ridges are formed as one piece with the base portion. At least one of the ventilation apertures is preferably located between each of the extended heat dissipating surfaces, such as fins.

In accordance with another aspect of the present invention, a heat sink comprises a base portion having first and second sides and at least first and second levels of mounting surfaces on the first side. The first level mounting surfaces are located at a first level for supporting a first electronic component board generally at the first level, and the second level mounting surfaces are located at a second level for supporting a second electronic component board generally at the second level. At least some of the first level mounting surfaces are formed on mounting ridges defining, along with the first board, at least one channel on the first side of the base portion. Ventilation apertures extend through an approximately central section of the base portion in fluid communication with the channel (s). Most preferably, extended heat dissipating surfaces extend from the second side of the base portion.

In accordance with a further aspect of the present invention, an electronic component board and heat sink subassembly comprises a heat sink including a base portion having first and second levels of mounting surfaces, a first electronic component board mounted to the first level mounting surfaces generally at a first level, and a second electronic component board mounted to the second level mounting surfaces generally at a second level. Mounting the electronic component boards directly to the heat sink allows the relatively flexible boards to conform to the unevenness of the heat sink both statically and dynamically, including thermal expansion and contraction. This enhances the surface overlap or contact between the heat sink base portion and the electronic components requiring cooling.

In one preferred embodiment of this subassembly, the first level mounting surfaces are formed on mounting ridges, which define at least one channel on the first side of the base portion. Ventilation apertures are preferably located between the extended heat dissipating surfaces and extend through an approximately central section of the base portion in fluid communication with the channel(s). Substantially flat electronic component support pads are preferably located on the first side of the base portion in contact with respective electronic components on one or both of the electronic component boards.

In accordance with a further aspect of the present invention, an electronic assembly comprises a heat sink having a base portion with mounting surfaces and extended heat dissipating surfaces. At least one electronic component board is mounted to the mounting surfaces, and a chassis contains the heat sink and the electronic component board.

At least one isolator bushing is mounted to one of the extended heat dissipating surfaces, and at least one pin extends from the chassis into the isolator bushing for mechanically securing and isolating the heat sink. The heat sink is, in addition, grounded to the electronic component board via the mounting screws mounting the board to the heat sink and is electrically isolated from the chassis.

According to one preferred embodiment of the electronic assembly, insulated fasteners are secured to the first side of the base portion, preferably within counterbores. A tray is secured to the insulated fasteners such that the insulated fasteners electrically isolate the heat sink from the tray.

According to yet another aspect of the present invention, a method of assembling an electronic assembly comprises mounting the first electronic component board to the first level of mounting surfaces on the heat sink and securing insulated fasteners to the first side of the heat sink. The second electronic component board is mounted to the second level of mounting surfaces on the heat sink with holes in the second electronic component board receiving the insulated fasteners to align and guide the second electronic component board. A tray is mounted to the insulated fasteners, thereby forming an electronic subassembly. The electronic subassembly is mounted within a chassis, and the heat sink is preferably mechanically and electrically isolated from the chassis, while positively secured to the chassis to eliminate potential damage due to vibration and seismic activities.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Figure 1:
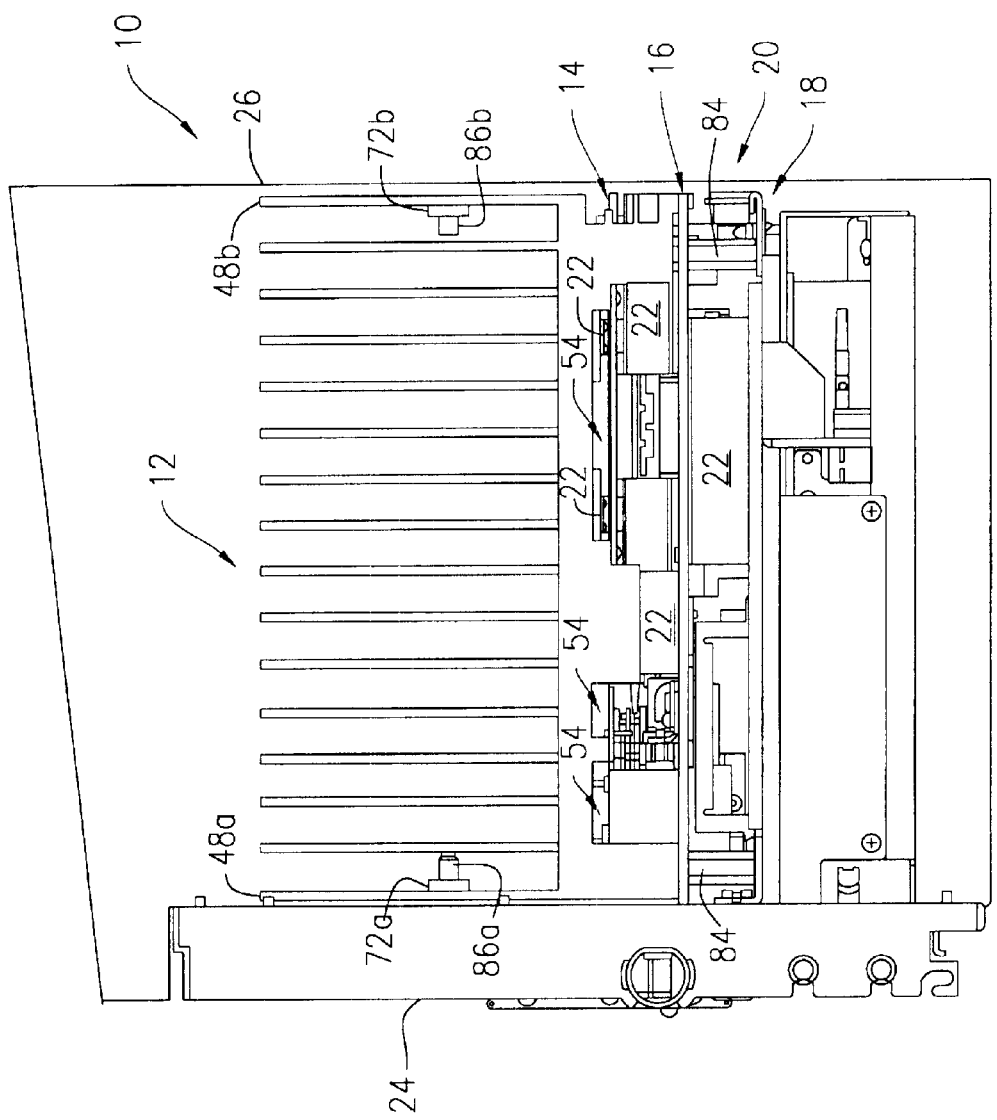
FIG. 1 is a side schematic view of an electronic assembly, according to one embodiment of the present invention.

Referring to FIG. 1, one embodiment of an electronic assembly 10 includes a heat sink 12 with first and second electronic component boards 14, 16, such as printed wiring boards (PWBs), and a pan tray 18 mounted to the heat sink 12, forming a subassembly. The subassembly is mounted to a front panel 24 and enclosed in a chassis 26. In the exemplary embodiment, the electronic assembly 10 uses natural convection and radiation cooling methods. The electronic component boards 14, 16 both include electronic components 22 on one or both sides. According to the exemplary embodiment, the electronic assembly 10 is an optical amplifier with two PWBs having various electronic components including, but not limited to, laser pumps, a Raman optical module, an erbium doped fiber amplifier (EDFA) optical module, and an erbium doped fiber module (EDFM) oven (22a–e). The heat sink 12 can also be used with other types of electronic equipment using other types of cooling methods.

Figure 2:
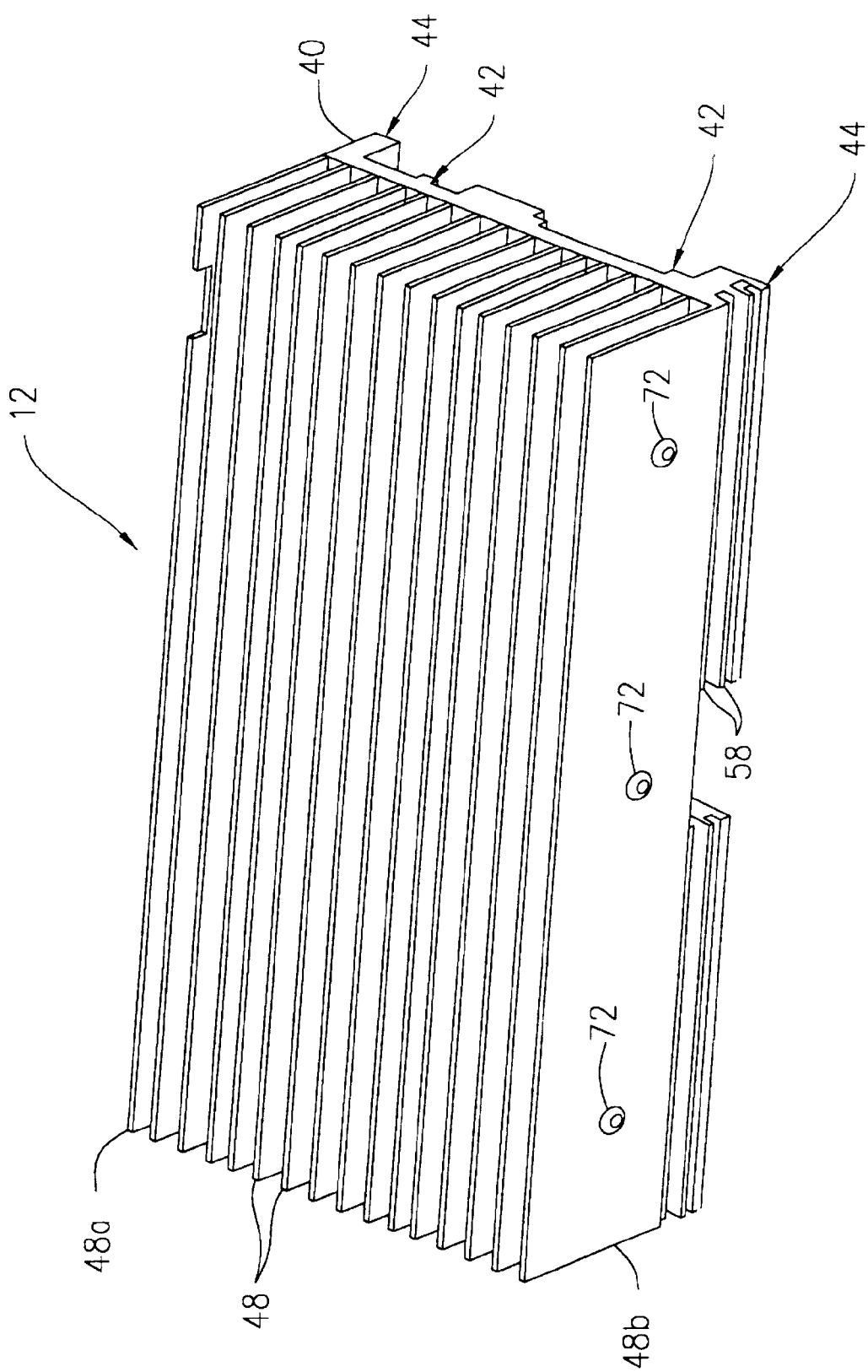
FIG. 2 is a top perspective view of a heat sink used in the electronic assembly, according to one embodiment of the present invention.
Figure 3:
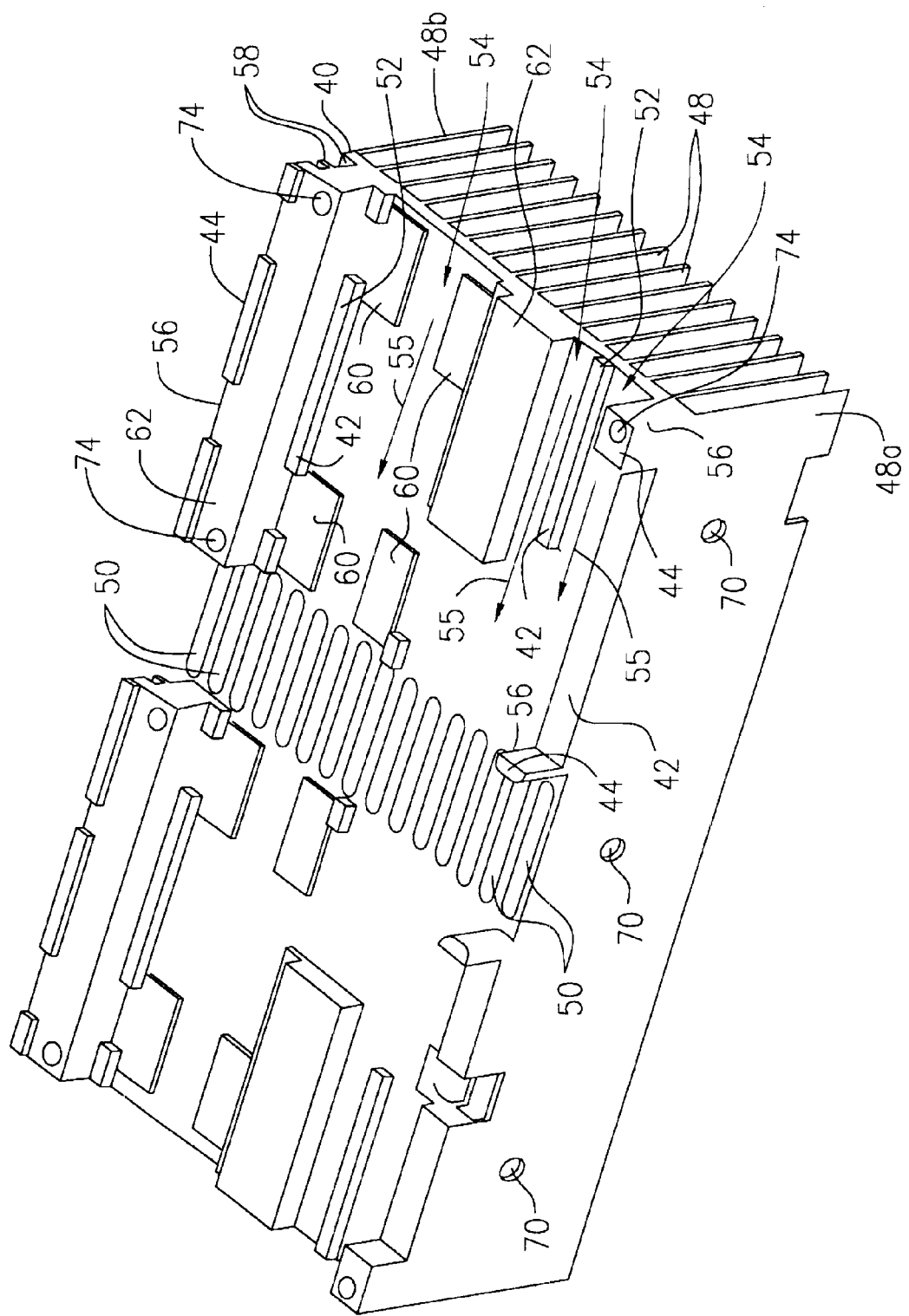
FIG. 3 is a bottom perspective view of the heat sink shown in FIG. 2.
Figure 4:
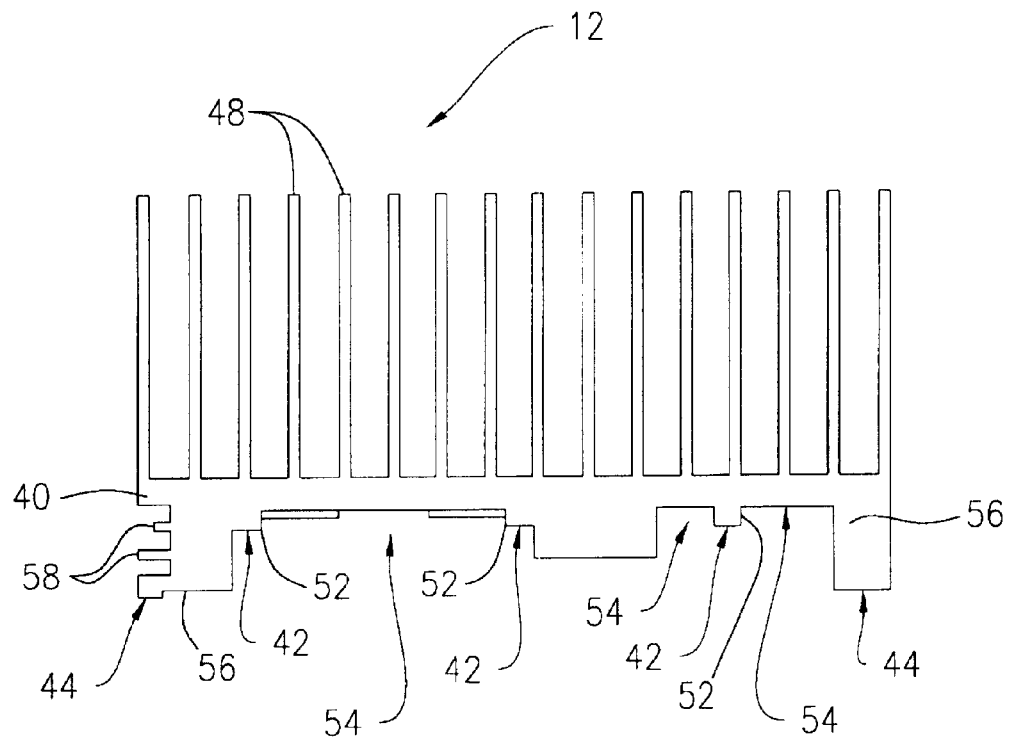
FIG. 4 is a side view of the heat sink shown in FIG. 2.

One preferred embodiment of the heat sink 12, as shown in FIGS. 2–4, includes a base portion 40 having first and second levels of board mounting surfaces 42, 44 extending from a first side. Extended heat dissipating surfaces 48, such as fins, extend from a second side of the base portion 40. The first level mounting surfaces 42 support the first electronic component board 14 (see FIG. 1), and the second level mounting surfaces 44 support the second electronic component board 16 (see FIG. 1). This preferred embodiment of the heat sink 12 is substantially symmetrical to facilitate manufacturing and assembly. Thus, reference numbers are included on only one side of the heat sink 12. Although the exemplary embodiment shows first and second levels of mounting surfaces 42, 44, the heat sink 12 can include mounting surfaces at only one level or mounting surfaces at more than two levels.

The extended heat dissipating surfaces 48 spread and dissipate the heat transferred to the base portion 40 from the electronic components 22. Although the exemplary embodiment shows fins, other forms or shapes of extended heat dissipating surfaces 48 are also contemplated.

One example of the heat sink 12 is about 10 in. deep by about 20 in. wide by about 4 in. high. In this example, the base portion 40 has a thickness of about 0.0500 in. and the extended heat dissipating surfaces 48 have a height of about 4.0 in. and a spacing of about 0.700 in. between adjacent surfaces. These dimensions are designed for optimal thermal performance to meet the environmental and power dissipation requirements for one type of electronic equipment. The heat sink 12 can have other dimensions for other types of electronic equipment with different requirements. According to one example, the heat sink 12 is made by aluminum extrusion processes and/or aluminum dip brazing where fins are added to the base as a second operation, for example, in the case where the fin height to fin spacing aspect ratio is larger than 4.

Figure 9:
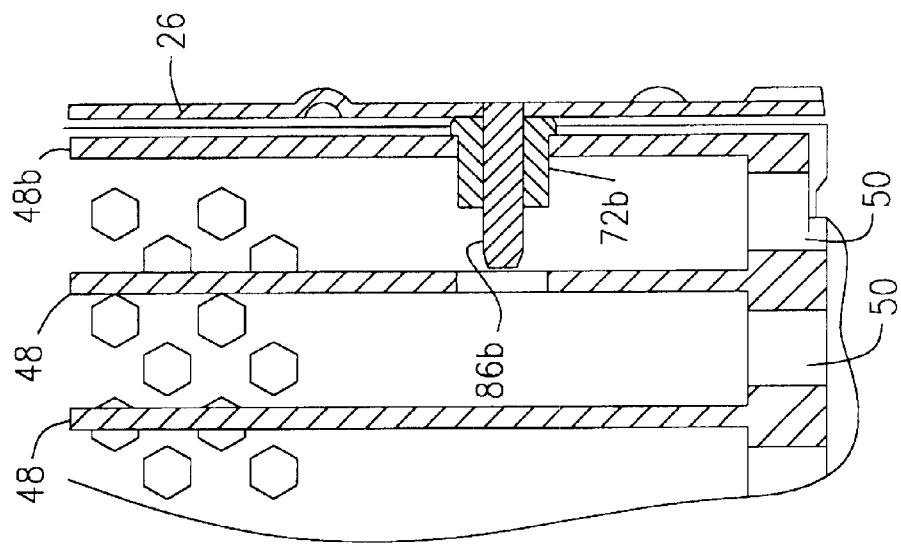
FIG. 9 is a side view of a portion of the heat sink coupled to a chassis, according to one embodiment of the present invention.

Ventilation apertures 50 are preferably located generally at approximately the central section of the base portion 40 and extend through the base portion 40 between the extended heat dissipating surfaces 48 (see FIG. 9). The ventilation apertures 50 create a "chimney" effect to channel and move stagnant air up from approximately the center region of the heat sink 12. Providing for the ventilation apertures 50 is contrary to accepted wisdom in the art, because the use of metal and other solid surfaces are typically added to dissipate or spread the heat and create larger surface areas for radiation; but in the present case, modeling experiments have shown that the use of the apertures, creating a "chimney" effect, to channel stagnant air improved heat sink performance by a factor of at least about 10%. Although the heat sink 12 is used in a system with natural convection cooling according to the exemplary embodiment, the heat sink 12 can also be used in a forced convection cooling system.

In the exemplary embodiment, the ventilation apertures 50 include a slot located between each of the extended heat dissipating surfaces 48 (e.g., the fins). According to one example, the slots have an optimal size of about 0.375 in. by 3 in., although the size of the slots varies depending on the size of the heat sink 12. One preferred ratio of the area of the ventilation apertures 50 to the area of the base portion 40 is about ⅙. Other shapes of the ventilation apertures 50 are also contemplated including, but not limited to, one or more circular holes between each of the fins on the outside of apertures 50.

The first level mounting surfaces 42 are preferably formed on mounting ridges 52 extending from the first side of the base portion 40. The mounting ridges 52 preferably provide a continuous support for the boards 14, 16 as opposed to the individual fastening points provided by standoffs or spacers. The mounting ridges 52 also act as walls to create channels 54 on the first side of the base portion 40. When the electronic component board 14 is mounted to the mounting surfaces 42, the channels 54 are used to efficiently draw air, as indicated by arrows 55, and channel it up the "chimney" created by the ventilation apertures 50. The mounting ridges 52 are preferably one-piece with the base portion 40 of the heat sink 12 to minimize the number of parts and to facilitate grounding the electronic component board 14 to the heat sink 12. In one example, the mounting ridges 52 are formed with the base portion 40 as part of the extrusion profile.

The second level mounting surfaces 44 are preferably formed on mounting members 56 extending from the first side of the base portion 40. The mounting members 56 are preferably one-piece with the base portion 40 of the heat sink 12 to minimize the number of parts and to facilitate grounding the electronic component board 16 to the heat sink 12. In the exemplary embodiment, additional heat dissipating surfaces 58 extend from one of the mounting members 56. The additional heat dissipating surfaces 58 further increase the surface area for more convective and radiative cooling effect.

Electronic component support pads 60, 62 are located on the first side of the base portion 40 for supporting electronic components 22 on the electronic component boards 14, 16. In the exemplary embodiment, the first group of electronic component support pads 60 supports electronic components 22, such as laser pumps, on the first electronic component board 14. The pads 60 are preferably maintained flat individually with no relationship from one pad to another, thus minimizing or eliminating the need to maintain flatness across the heat sink surface. The second group of electronic component pads 62 supports electronic components 22, such as power modules, on the second electronic component board 16.

Figure 5:
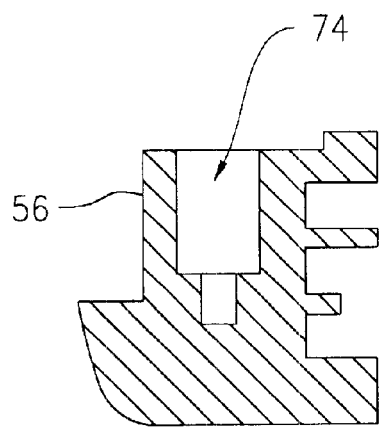
FIG. 5 is a cross-sectional view of a counterbore in the heat sink, according to one embodiment of the present invention.

According to the exemplary embodiment, bushing support holes 70 are located in the extended heat dissipating surfaces 48a, 48b at one or both ends of the heat sink 12. The bushing support holes 70 receive isolator bushings 72 (FIG. 2), as will be described in greater detail below. The exemplary embodiment of the heat sink 12 further includes counterbore holes 74, shown in greater detail in FIG. 5, located on the first side of the base portion 40, for example, in the mounting members 56. The counterbore holes 74 receive insulated fasteners (not shown), as will be described in greater detail below.

Figure 6:
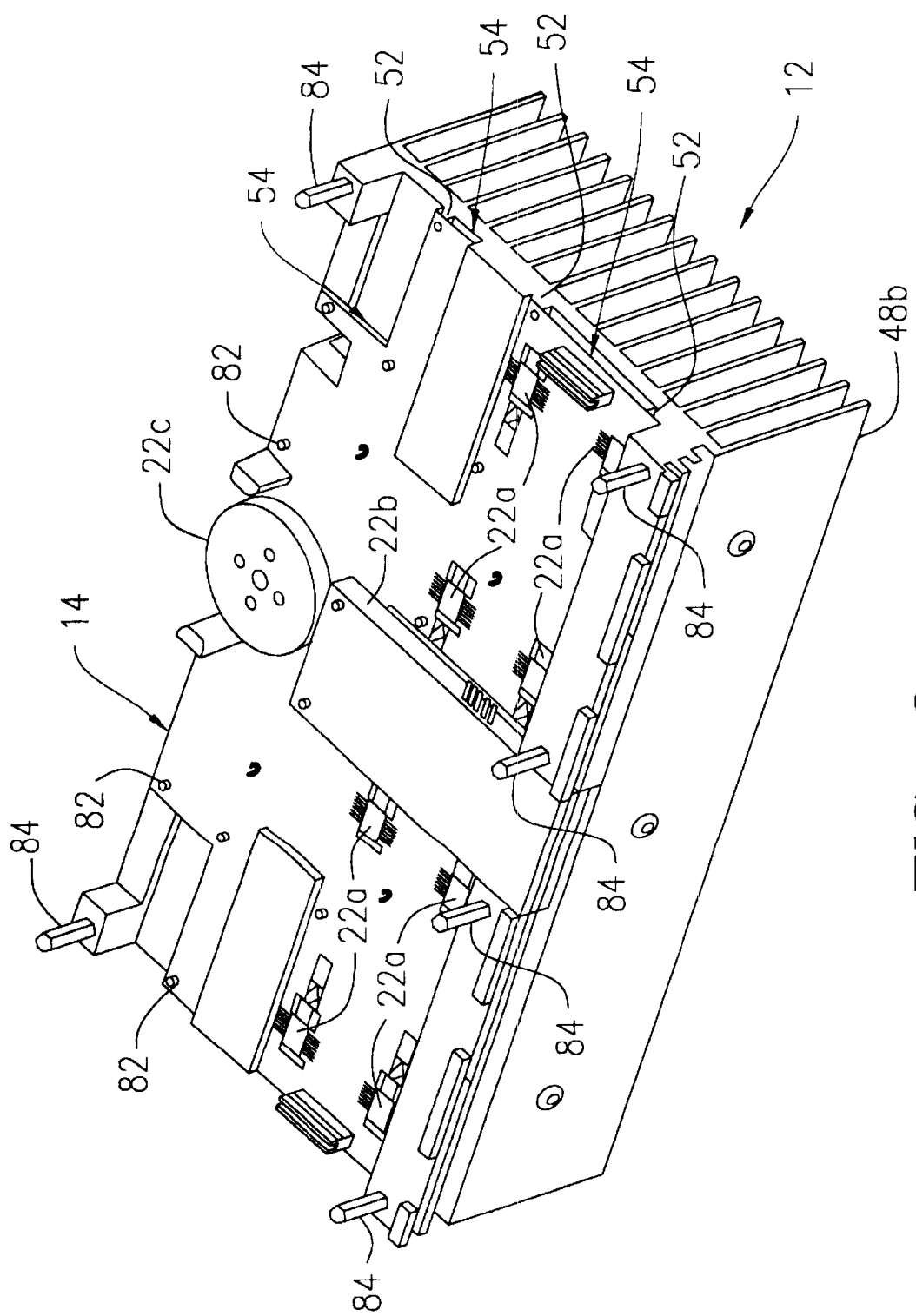
FIG. 6 is a bottom perspective view of the heat sink shown in FIG. 3 with a first electronic component board mounted thereto.

According to one method of assembling the electronic assembly 10, the heat sink 12 is used as the base or foundation in a top/down gravity assisted assembly operation. The first electronic component board 14 is mounted to the first level mounting surfaces 42 on mounting ridges 52, as shown in FIG. 6. In the exemplary embodiment, the first electronic component board 14 includes electronic components, such as Raman pumps 22a, supported on the first level electronic component pads 60 (not shown in FIG. 6). The first electronic component board 14 is secured and electrically grounded to the mounting ridges 52 using mounting screws 82 or other suitable fasteners. Additional components, such as a Raman optical module 22b and take up spool 22c, can then be mounted on the first electronic component board 14.

Insulated fasteners 84, such as jackscrews, are secured to the base portion 40 of the heat sink 12, preferably within the counterbores 74. The jackscrews can be made of ABS, Delrin, or other insulating material. The counterbore 74 limits the travel of the jackscrew and provides support for the jackscrew to prevent shearing of the threaded portion. Alternatively, other types of insulated fasteners can be secured to the base portion 40 of the heat sink 12 without the counterbores 74.

Figure 7:
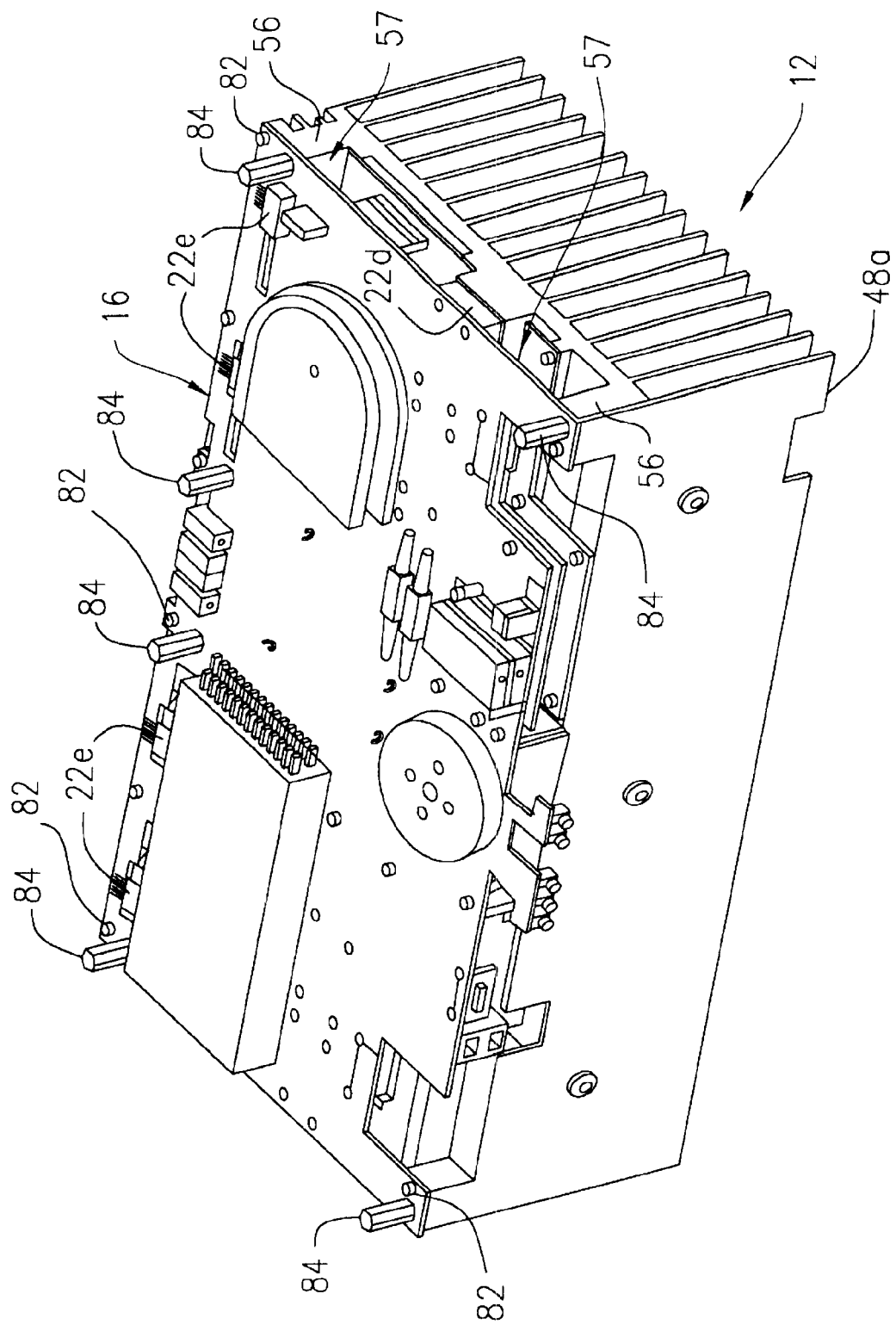
FIG. 7 is a bottom perspective view of the heat sink shown in FIG. 6 with a second electronic component board mounted thereto.

As shown in FIG. 7, the second electronic component board 16 is positioned over the first electronic component board 14 and mounted to the second level mounting surfaces 44 on mounting members 56. Channels 57 are also formed between the first and second boards 14, 16 to channel air through apertures in the first board 14 and up the "chimney" created by the apertures 50 in the heat sink 12. In the exemplary embodiment, the electronic component board 16 includes electronic components, such as power modules 22d and EDFA pumps 22e, supported on the second level pads 62 (see FIG. 3). The second electronic component board 16 preferably includes holes for receiving the insulated fasteners 84 such that the insulated fasteners 84 guide and align the second electronic component board 16 while it is being plugged in to the first electronic component board 14. Mounting screws 82 are used to mount and electrically ground the second electronic component board 16 to the second level mounting surfaces 44.

The heat sink 12 is thus used to support the electronic component boards 14, 16 (as opposed to the boards supporting the heat sinks on spacers or standoffs). This allows the flexible material of the boards 14, 16 to conform to the heat sink 12 and any unevenness, for example, caused due to manufacturing processes and/or thermal expansion and contraction. Although the exemplary embodiment shows single boards 14, 16 mounted at each level, multiple electronic component boards can be mounted at each level.

Figure 8:
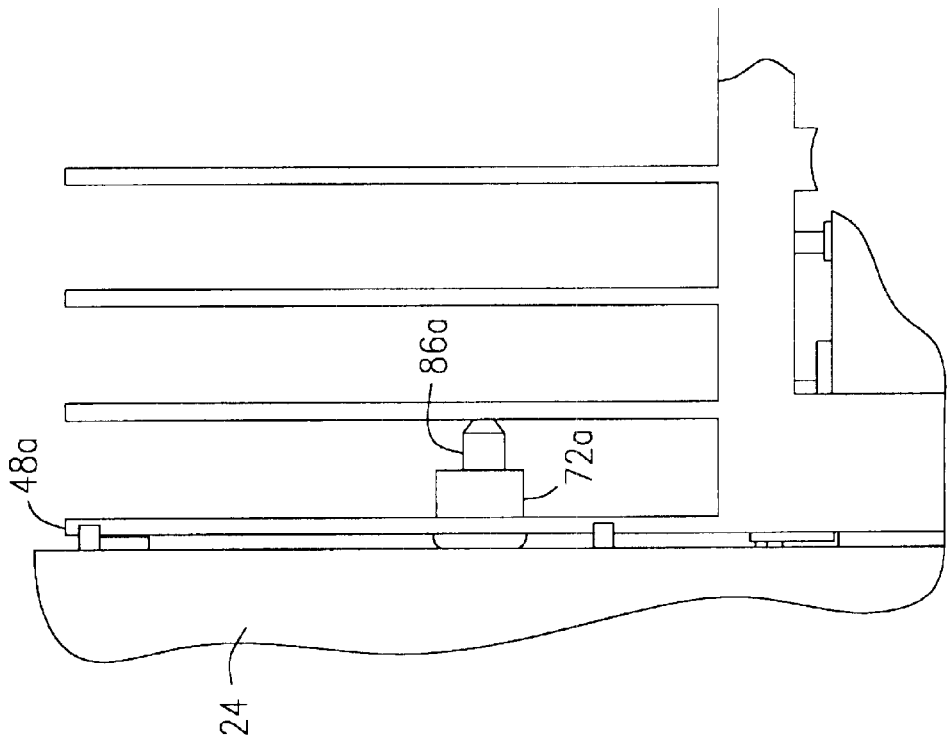
FIG. 8 is a side view of a portion of the heat sink coupled to a front panel, according to one embodiment of the present invention.

The metal pan tray 18 is then mounted to the insulated fasteners 84 to form the subassembly, the front panel 24 is then mounted to the subassembly, and the subassembly is mounted within the chassis 26 (see FIG. 1). The tray 18 is used to slide the subassembly 20 into the chassis 26 and to provide thermal isolation between the two tiers of the chassis 26 separated by the tray 18. As shown in FIGS. 8 and 9, the isolator bushings 72a, 72b in the extended heat dissipating surfaces 48a, 48b at each end of the heat sink 12 engage pins 86a, 86b extending from the front panel 24 and chassis 26, respectively. The heat sink 12 is thereby structurally supported and prevented from moving. The isolator bushings 72a, 72b are preferably snub bushings used as a flexible element to allow compression and to prevent the heat sink 12 from moving front-to-back. The snub bushings also provide mechanical securement, isolation from vibration, dampening of the subassembly during insertion into the chassis 26, electrical isolation between the heat sink (i.e., digital/circuit ground) and the chassis (i.e., earth/frame ground), and a relatively tight fit between the back surface of the chassis 26 and the front panel 24.

The heat sink 12 is grounded to the digital/circuit ground present on the electronic component boards 14, 16 through the mounting screws 82 to insure that the heat sink 12 is not electrically floating for safety reasons. The heat sink 12 is also used as an additional ground layer for improving shielding effectiveness of the electronic component boards 14, 16. The insulated fasteners 84 prevent electrical contact between the heat sink 12 (i.e. circuit ground) and the chassis 26 (i.e., frame ground). In the exemplary electronic equipment 10, the heat sink 12 is electrically isolated from the earth ground/frame ground to insure that the sensitive laser pumps are not prone to electrostatic discharge (ESD), lightening, or other events that the chassis may be subject to.

The top/down gravity assisted assembly minimizes or eliminates the need for handling and flipping during assembly. In operation, the electronic components 22a–e on the electronic component boards 14, 16 act as heat sources. The heat is conducted to the base portion 40 of the heat sink 12, which spreads and dissipates the heat. Air is channeled through the channels 54 and up through the ventilation apertures 50, creating the chimney effect. The heat sources or electronic components on the boards 14, 16 are preferably balanced or symmetric on each side of the ventilation apertures to facilitate the chimney effect.

Accordingly, the heat sink of the present invention is capable of adequately spreading and dissipating heat in a natural convection cooling environment. In addition to thermal features, the heat sink is capable of improving mechanical stability and the assembly process. The heat sink is further capable of improving EMI shielding and other electrical grounding and isolation features.

Modifications and substitutions by one of ordinary skill in the art are considered to be within the scope of the present invention, which is not to be limited except by the following claims.

The invention claimed is:

1. An electronic assembly comprising:
   a heat sink having a base portion with a plurality of mounting surfaces on a first side of said base portion, and extended heat dissipating surfaces extending from a second side of said base portion;
   at least one electronic component board mounted to said mounting surfaces, wherein said heat sink is grounded to said electronic component board;
   a chassis containing said heat sink and said electronic component board;
   at least one isolator bushing mounted to one of said extended heat dissipating surfaces; and
   at least one pin extending from said chassis into said isolator bushing for mechanically securing and isolating said heat sink, wherein said heat sink is electrically isolated from said chassis.

2. The electronic assembly of claim 1 further including insulated fasteners secured to said first side of said base portion.

3. The electronic assembly of claim 2 wherein said insulated fasteners are secured within counterbores.

4. The electronic assembly of claim 2 further comprising a tray secured to said insulated fasteners, wherein said insulated fasteners isolate said heat sink from said tray.

5. The electronic assembly of claim 4 wherein said base portion includes at least first and second levels of said mounting surfaces, and wherein said at least one electronic component board includes at least first and second electronic component boards mounted to respective said first and second levels of mounting ridges at respective first and second levels.

6. The electronic assembly of claim 1 wherein at least some of said mounting surfaces are formed on mounting ridges, wherein said mounting ridges define at least one channel on said first side of said base portion, wherein a plurality of ventilation apertures extend through an approximately central section of said base portion in fluid communication with said at least one channel, and
   wherein said plurality of apertures are located between said plurality of extended heat dissipating surfaces.

7. The electronic assembly of claim 1 further including a plurality of electronic component support pads on said first side of said base portion, wherein said electronic component support pads are substantially flat and contact respective electronic components on said electronic component board.

8. The electronic assembly of claim 1 wherein at least one isolator bushing is mounted in said extended heat dissipating surfaces at each end of said heat sink.

9. An electronic assembly comprising:
   a heat sink comprising:
      a base portion having first and second sides, wherein a plurality of ventilation apertures extend through an approximately central section of said base portion;
      at least first and second levels of mounting surfaces on said first side of said base portion, wherein at least some of said first level mounting surfaces are formed on mounting ridges; and
      extended heat dissipating surfaces extending from a second side of said base portion;
   a first electronic component board mounted to said first level mounting surfaces generally at a first level, wherein said mounting ridges and said first electronic component define at least one channel on said first side of said base portion;
   a second electronic component board mounted to said second level mounting surfaces generally at a second level, wherein said heat sink is grounded to at least one of said electronic component boards; and
   a chassis containing said heat sink and said electronic component boards mounted thereto, wherein said heat sink is electrically isolated from said chassis.

10. The electronic assembly of claim 9 further comprising:
    at least one isolator bushing mounted to one of said extended heat dissipating surfaces of said heat sink; and
    at least one pin extending from said chassis into said bushing for mechanically securing and isolating said heat sink.

11. The electronic assembly of claim 7 further including insulated fasteners secured to said first side of said base portion.

12. The electronic assembly of claim 11 wherein said insulated fasteners are secured within counterbores.

13. The electronic assembly of claim 11 further comprising a tray secured to said insulated fasteners, wherein said insulated fasteners isolate said heat sink from said tray.

14. A method of assembling an electronic assembly including first and second electronic component boards having electronic components and a heat sink, said heat sink comprises a base portion having first and second sides, at least first and second levels of mounting surfaces on said first side, and extended heat dissipating surfaces extending from said second side, said method comprising:
    mounting said first electronic component board to said first level of mounting surfaces on said heat sink;
    securing insulated fasteners to said first side of said heat sink;

mounting said second electronic component board to said second level of mounting surfaces on said heat sink, wherein holes in said second electronic component board receive said insulated fasteners to align said second electronic component board;

mounting a tray to said insulated fasteners, thereby forming an electronic subassembly; and mounting said electronic subassembly within a chassis.

15. The method of claim 14 wherein mounting said electronic subassembly within said chassis includes mechanically and electrically isolating said heat sink from said chassis.

* * * * *